United States Patent
Wang et al.

(10) Patent No.: US 11,686,532 B2
(45) Date of Patent: Jun. 27, 2023

(54) HEAT DISSIPATION STRUCTURE

(71) Applicant: COOLER MASTER CO., LTD., New Taipei (TW)

(72) Inventors: Chi-Chuan Wang, New Taipei (TW); Chang-Yu Hsieh, New Taipei (TW); Shan-Yin Cheng, New Taipei (TW); Hsiang-Fen Chou, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 49 days.

(21) Appl. No.: 17/112,741

(22) Filed: Dec. 4, 2020

(65) Prior Publication Data

US 2021/0088288 A1  Mar. 25, 2021

Related U.S. Application Data

(62) Division of application No. 15/921,623, filed on Mar. 14, 2018, now Pat. No. 10,907,907.

(30) Foreign Application Priority Data

Dec. 26, 2017 (TW) ................. 106145694

(51) Int. Cl.
*F28D 15/02* (2006.01)
*H05K 7/20* (2006.01)
*F28F 13/08* (2006.01)
*F28F 3/12* (2006.01)
*F28D 21/00* (2006.01)

(52) U.S. Cl.
CPC ..... *F28D 15/0266* (2013.01); *F28D 15/0233* (2013.01); *F28F 3/12* (2013.01); *F28F 13/08* (2013.01); *F28D 2015/0216* (2013.01); *F28D 2021/0028* (2013.01); *H05K 7/20* (2013.01); *H05K 7/20336* (2013.01)

(58) Field of Classification Search
CPC ......... F28D 15/0266; F28D 2015/0216; F28D 2021/0028; F28F 13/08; H05K 7/20366
See application file for complete search history.

(56) References Cited

U.S. PATENT DOCUMENTS 1,622,376 A * 3/1927 Davenport ............ F25B 39/024
                                                    165/170
2,058,871 A  10/1936 Heath
2,934,322 A   4/1960 Hazard
(Continued)

*Primary Examiner* — Leonard R Leo
(74) *Attorney, Agent, or Firm* — Dickinson Wright PLLC

(57) ABSTRACT

The disclosure is related to a heat dissipation structure. The heat dissipation structure is adapted to accommodate a fluid and thermally contact a heat source. The heat dissipation structure includes a heat conductive plate and a channel arrangement. The heat conductive plate is configured to thermally contact the heat source. The channel arrangement is located on the heat conductive plate, and the channel arrangement includes a wider channel portion and a narrower channel portion. The wider channel portion is wider than the narrower channel portion, and the wider channel portion is connected to the narrower channel portion so that the channel arrangement forms a loop. The channel arrangement is configured to accommodate the fluid and allow the fluid to absorb heat generated by the heat source through the heat conductive plate so as to at least partially change phase of the fluid.

3 Claims, 8 Drawing Sheets

(56) References Cited

U.S. PATENT DOCUMENTS

| | | | |
|---|---|---|---|
| 3,226,602 A | 12/1965 | Elfving | |
| 3,782,134 A * | 1/1974 | Meess | F25B 15/10 |
| | | | 165/170 |
| 3,817,321 A | 6/1974 | von Cube et al. | |
| 4,550,774 A | 11/1985 | Andes et al. | |
| 4,735,609 A | 4/1988 | Comeau et al. | |
| 4,921,041 A * | 5/1990 | Akachi | F28D 15/0266 |
| | | | 165/104.26 |
| 5,060,722 A * | 10/1991 | Zdenek | F28F 13/08 |
| | | | 165/170 |
| 5,076,350 A | 12/1991 | Grantz et al. | |
| 5,076,351 A | 12/1991 | Munekawa et al. | |
| 5,755,278 A | 5/1998 | Shinohara et al. | |
| 5,946,939 A | 9/1999 | Matsushima et al. | |
| 6,164,368 A | 12/2000 | Furukawa et al. | |
| 6,672,373 B2 * | 1/2004 | Smyrnov | F28D 15/0266 |
| | | | 165/104.26 |
| 7,080,680 B2 | 7/2006 | Ota et al. | |
| 7,998,427 B2 | 8/2011 | Guarino | |
| 8,919,426 B2 * | 12/2014 | Hardesty | F28D 15/0233 |
| | | | 165/104.26 |
| 9,423,192 B2 | 8/2016 | Tsoi et al. | |
| 10,260,819 B2 * | 4/2019 | Chou | F28F 3/14 |
| 2006/0157227 A1 | 7/2006 | Choi et al. | |

\* cited by examiner

HEAT DISSIPATION STRUCTURE

CROSS-REFERENCE TO RELATED APPLICATIONS

This non-provisional application is a divisional of U.S. application Ser. No. 15/921,623, filed Mar. 14, 2018, which claims priority under 35 U.S.C. § 119(a) on Patent Application No(s). 106145694 filed in Taiwan, R.O.C. on Dec. 26, 2017, the entire contents of which are hereby incorporated by reference.

TECHNICAL FIELD

The disclosure relates to a heat dissipation structure, more particularly to a heat dissipation structure having a wider channel portion and a narrower portion.

BACKGROUND

Work performance of electronic components increase with the progress of technology, but it also generates more heat during operation. Therefore, the electronic components with high work performance are required to cooperate with a heat dissipation device with higher heat dissipation effect, such as an oscillating heat pipe structure. In general, the oscillating heat pipe structure is a heat conductive plate formed with a circulation channel, and the circulation channel is filled with liquid coolant. When the oscillating heat pipe structure thermally contacts the electronic component, the liquid coolant absorbs heat generated by the electronic component, such that the liquid coolant would change its phase so as to be circulated in the circulation channel, thereby decreasing the temperature of the electronic component.

SUMMARY OF THE INVENTION

One embodiment of the disclosure provides a heat dissipation structure is adapted to accommodate a fluid and thermally contact at least one heat source. The heat dissipation structure includes a heat conductive plate and a channel arrangement. The heat conductive plate is configured to thermally contact the at least one heat source. The channel arrangement is located on the heat conductive plate, and the channel arrangement includes a wider channel portion and a narrower channel portion. The width of the wider channel portion is wider than the width of the narrower channel portion, and the wider channel portion is connected to the narrower channel portion so that the channel arrangement forms a loop. The channel arrangement is configured to accommodate the fluid, and allow the fluid to absorb heat generated by the at least one heat source through the heat conductive plate so as to at least partially change phase of the fluid.

One embodiment of the disclosure provides a heat dissipation structure is adapted to accommodate a fluid and thermally contact at least one heat source. The heat dissipation structure includes a heat conductive plate and a plurality of split structures. The heat conductive plate is configured to thermally contact the at least one heat source. The heat conductive plate has a fluid storage chamber. The split structures are dent on the heat conductive plate so as to divide the fluid storage chamber into a plurality of wider channels and a plurality of narrower channels that are connected to one another so as to form a channel arrangement. Each of the wider channels is wider than each of the narrower channels. The channel arrangement is configured to accommodate the fluid, and allow the fluid to absorb heat generated by the at least one heat source through the heat conductive plate so as to at least partially change phase of the fluid.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
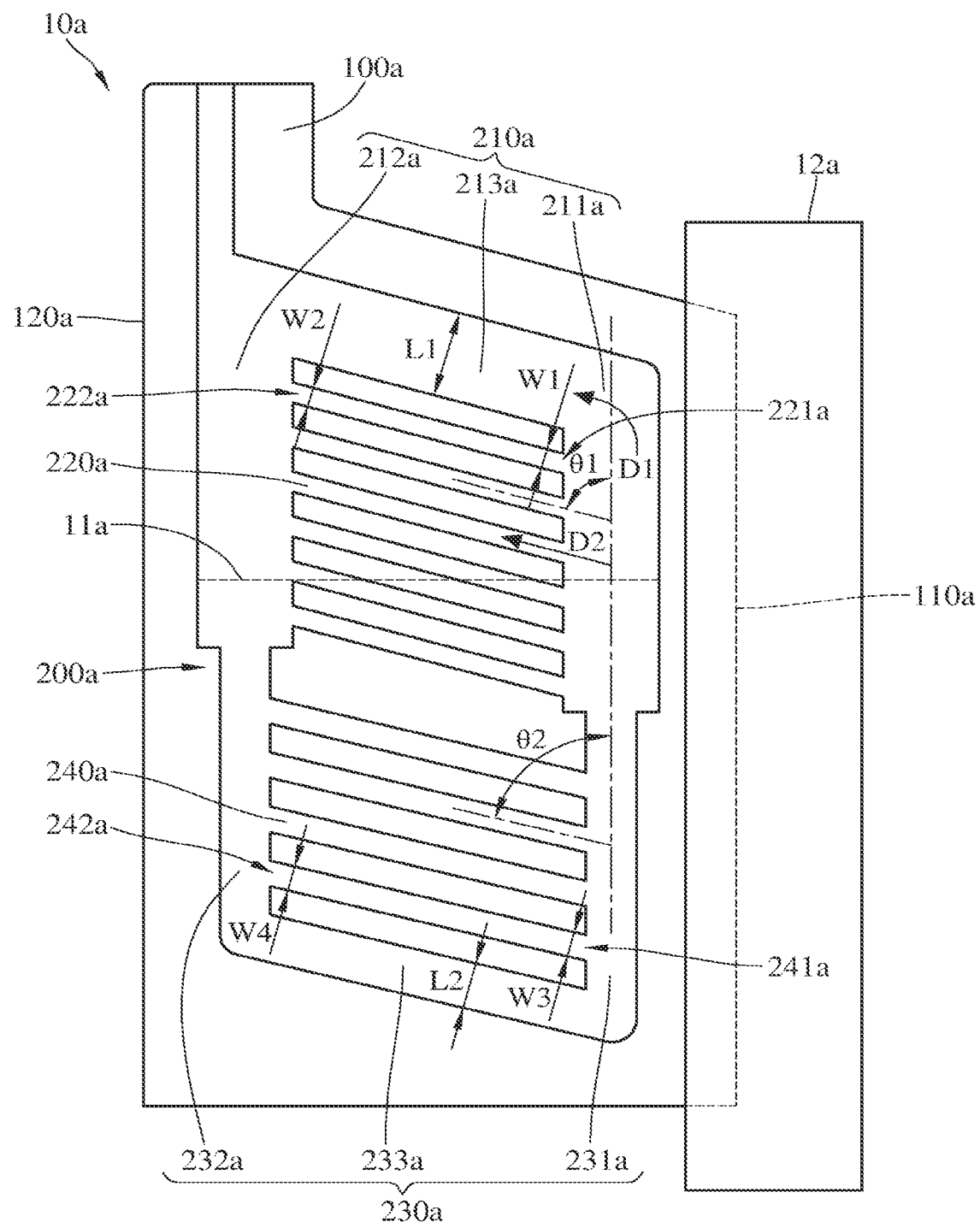
FIG. 1 is a front view of a heat dissipation structure according to a first embodiment of the disclosure while the heat dissipation structure is in thermal contact with a heat source.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1. FIG. 1 is a front view of a heat dissipation structure according to a first embodiment of the disclosure while the heat dissipation structure is in thermal contact with a heat source.

This embodiment provides a heat dissipation structure 10a, and the heat dissipation structure 10a is adapted to accommodate a fluid 11a and thermally contact a heat source 12a. The fluid 11a is coolant. The heat source 12a is, for example, a CPU. In practical experience, the boiling temperature of the coolant falls within a temperature interval of a normally operating CPU; that is, the temperature of the normally operating CPU can boil the coolant, in order to prevent the CPU from failure due to overly high temperature. For example, the boiling temperature of the coolant is 50° C., and the CPU can normally operate in a temperature ranging between 40° C. and 65° C. In this embodiment, the heat dissipation structure 10a includes a heat conductive plate 100a and a channel arrangement 200a.

The heat conductive plate 100a has a heat absorbing edge 110a and a condensing edge 120a opposite to each other. The heat absorbing edge 110a is configured to thermally contact the heat source 12*a*. The channel arrangement 200*a* is located on the heat conductive plate 100*a* and configured for the circulation of the fluid 11*a* and the gaseous form thereof. In detail, the channel arrangement 200*a* includes a wider channel portion 210*a*, a plurality of first connecting channels 220*a*, a narrower channel portion 230*a* and a plurality of second connecting channels 240*a*.

The wider channel portion 210*a* includes a first wider channel 211*a*, a second wider channel 212*a*, and a third wider channel 213*a*. The first wider channel 211*a* and the second wider channel 212*a* are respectively close to the heat absorbing edge 110*a* and the condensing edge 120*a*, and two opposite ends of the third wider channel 213*a* are respectively connected to the first wider channel 211*a* and the second wider channel 212*a*.

Two opposite ends of each first connecting channel 220*a* are respectively connected to the first wider channel 211*a* and the second wider channel 212*a*. Each first connecting channel 220*a* forms an first acute angle $\theta 1$ with respect to the first wider channel 211*a*, and the first angle $\theta 1$, in this embodiment, ranges between 10 degrees and 90 degrees. Each first connecting channel 220*a* has two first ports 221*a* and 222*a* opposite to each other, and the first ports 221*a* and 222*a* are respectively connected to the first wider channel 211*a* and the second wider channel 212*a*. In each first connecting channel 220, a width W2 of the first port 222*a* connected to the second wider channel 212*a* is equal to a width W1 of the first port 221*a* connected to the first wider channel 211*a*. That is, the width of the first connecting channel 220*a* is maintained at the same size from the condensing edge 120*a* to the heat absorbing edge 110*a*.

The narrower channel portion 230*a* includes a first narrower channel 231*a*, a second narrower channel 232*a*, and a third narrower channel 233*a*. The first narrower channel 231*a* and the second narrower channel 232*a* are respectively close to the heat absorbing edge 110*a* and the condensing edge 120*a*, and respectively connected to two opposite ends of the third narrower channel 233*a*. An end of the first narrower channel 231*a* away from the third narrower channel 233*a* is connected to the first wider channel 211*a*, and an end of the second narrower channel 232*a* away from the third narrower channel 233*a* is connected to the second wider channel 212*a*, so that the channel arrangement 200*a* forms a loop. In this embodiment, the wider channels 211*a*-213*a* of the wider channel portion 210*a* are the same in width (e.g., a width L), the narrower channels 231*a*-233*a* of the narrower channel portion 230*a* are also the same in width (e.g., a width L2), and the width L1 is greater than the width L2. That is, the wider channel portion 210*a* is wider than the narrower portion 230*a*.

Two opposite ends of each second connecting channel 240*a* are respectively connected to the first narrower channel 231*a* and the second narrower channel 232*a*. Each second connecting channel 240*a* forms an second acute angles $\theta 2$ with respect to the first narrower channel 231*a*, and the second acute angle $\theta 2$, in this embodiment, ranges between 10 degrees and 90 degrees.

In this embodiment, the first acute angle $\theta 1$ between the first connecting channel 220*a* and the first wider channel 211*a* is equal to the second acute angle $\theta 2$ between the second connecting channel 240*a* and the first narrower channel 231*a*, but the present disclosure is not limited thereto. In some other embodiments, an angle between each first connecting channel and the first wider channel may be greater or smaller than an angle between each second connecting channel and the first narrower channel.

In addition, the first acute angles $\theta 1$ between the first connecting channels 220*a* and the first wider channel 211*a* are fixed at a specific value, but the present disclosure is not limited thereto. In some other embodiments, the angles between the first connecting channels and the first wider channel may vary. In the same manner, the second acute angles $\theta 2$ between the second connecting channels 240*a* and the first narrower channel 231*a* may be fixed or varied according to actual requirements.

Each of the second connecting channels 240*a* has two second ports 241*a* and 242*a* opposite to each other. The second ports 241*a* and 242*a* are respectively connected to the first narrower channel 231*a* and the second narrower channel 232*a*. In each second connecting channel 240*a*, a width W4 of the second port 242*a* connected to the second narrower channel 232*a* is equal to a width W3 of the second port 241*a* connected to the first narrower channel 231*a*. That is, the width of the second connecting channel 240*a* is maintained at the same size from the condensing edge 120*a* to the heat absorbing edge 110*a*.

In this embodiment, the channel arrangement 200*a* is configured to accommodate the fluid 11*a* and allow the fluid 11*a* to absorb heat generated by the heat source 12*a* through the heat conductive plate 100*a* so as to at least partially change phase of the fluid 11*a*. More specifically, when the fluid 11*a* absorbs heat near the heat absorbing edge 110*a*, it would be vaporized to be gaseous and naturally move toward the condensing edge 120*a* through the first wider channel 211*a* and the first connecting channels 220*a* along two directions D1 and D2 by the means of the rising characteristic of high temperature gas. Then, the gaseous fluid 11*a* reaching the condensing edge 120*a* would be condensed into liquid form via a thermal energy exchange between it and outer environment, and then the condensed fluid 11*a* would fall and return to the side near the heat absorbing edge 110*a* through the narrower channel portion 230*a* with the assistance of the gravity. As such, the fluid 11*a* is able to continuously absorb heat near the heat absorbing edge 110*a*.

In this embodiment, when the gaseous fluid 11*a* is flowing in the wider channel portion 210*a*, the resistance of the wider channels 211*a*-213*a* is relatively small because the wider channels 211*a*-213*a* are wider, such that the flowing velocity of the gaseous fluids 11*a* is increased, thereby accelerating the circulation of the fluid and improving the heat dissipation capability of the heat dissipation structure 10*a*.

In addition, the narrower channel portion 230*a* having relative smaller width is beneficial to create a capillary action when the fluid 11*a* is flowing therethrough, which helps the fluid 11*a* to flow more smoothly and fast in the narrower channel portion 230*a*, thereby improving the heat dissipation capability of the heat dissipation structure 10*a*.

Moreover, the first acute angles $\theta 1$ between the first connecting channels 220*a* and the first wider channel 211*a* and the second acute angles $\theta 2$ between the second connecting channels 240*a* and the first narrower channel 231*a* help that the gaseous fluid 11*a* to move toward the condensing edge 120*a* through the first connecting channels 220*a*, and the condensed fluid 11*a* to return to the heat absorbing edge 110*a* through the second connecting channel 240*a*. Therefore, it helps to improve the circulation of the fluid 11*a* in the channel arrangement 200*a* so as to improve the heat dissipation capability of the heat dissipation structure 10*a*.

Furthermore, due to the narrower channel portion 230*a* of the channel arrangement 200*a*, the usage of the fluid 11*a* being filled into the channel arrangement 200a is able to be decreased, helping to decrease the cost of the fluid 11a.

In the wider channel portion 210a of this embodiment, the wider channels 211-213 are the same in width (e.g., the widths L1), but the present disclosure is not limited thereto. In some other embodiments, the wider channels may be different in width. By doing so, it is able to increase the pressure driving force, such that the imbalance force produced in the channel arrangement is able to accelerate the speed of the cooling circulation so as to further improve the heat dissipation capability of the heat dissipation structure. The aforementioned imbalance force is produced by ΔP in Young-Laplace formula $$\Delta P = \sigma \left( \frac{1}{R_1} - \frac{1}{R_2} \right),$$

wherein R1 and R2 are respectively the radii of two pipes, σ is the surface tension of a fluid, and ΔP is the pressure driving force causing by variation of pipe width. In addition, similarly, the widths of the narrower channels and widths of the connecting channels may be different.

In this embodiment, the channel arrangement 200a has only one wider channel portion 210a and one narrower channel portion 230a, but the present disclosure is not limited thereto. In some other embodiments, the quantity of the wider channel portion and the narrower channel portion may be adjusted in accordance with the size of the heat conductive plate in order to uniformly conducted away heat generated by the heat source so as to enhancing the efficiency of heat dissipation.

Figure 2:
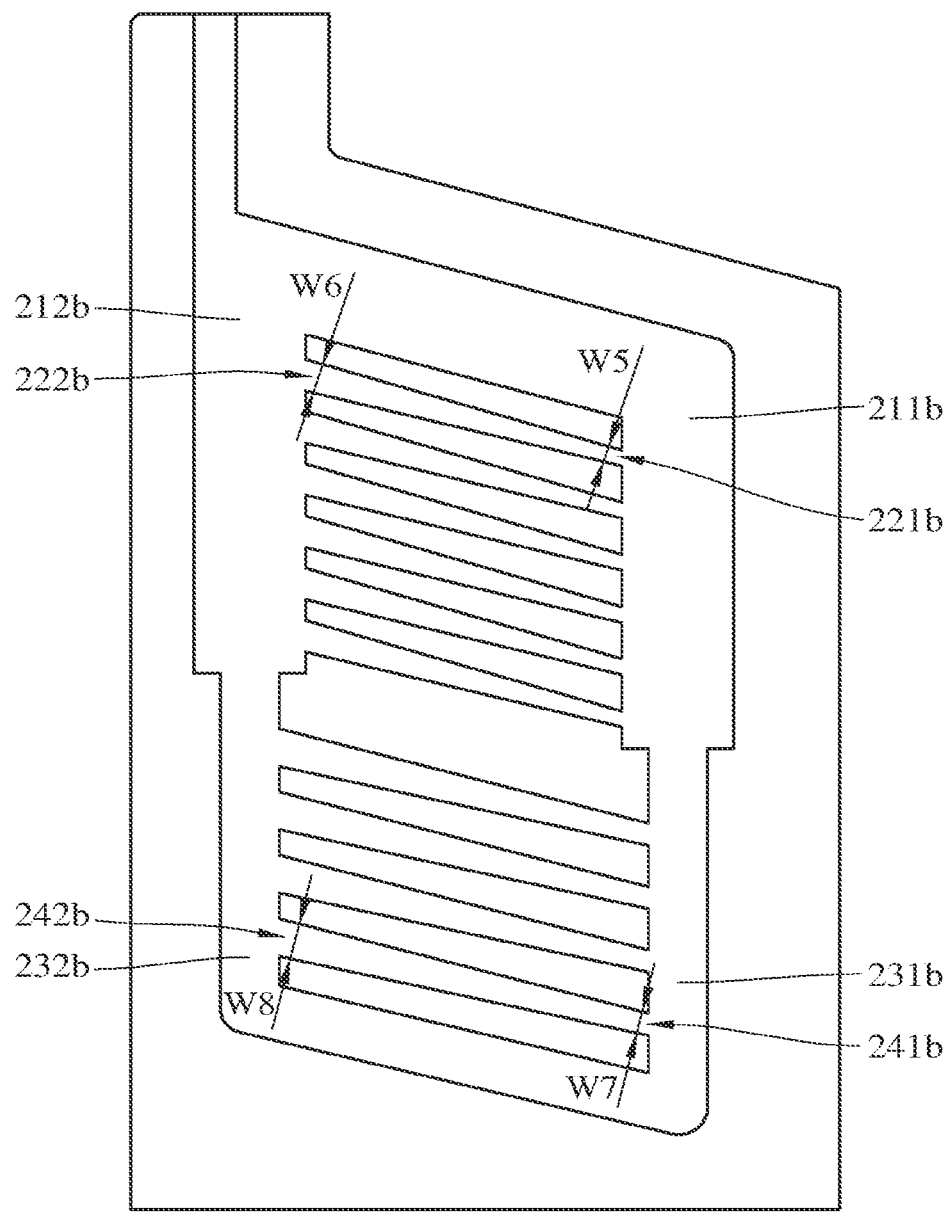
FIG. 2 is a front view of a heat dissipation structure according to a second embodiment of the disclosure.

In this embodiment, the width W1 of the first port 221a is equal to the width W2 of the first port 222a, and the width W3 of the second port 241a is equal to the width W4 of the second port 242a, but the present disclosure is not limited thereto. Please refer to FIG. 2. FIG. 2 is a front view of a heat dissipation structure according to a second embodiment of the disclosure.

This embodiment provides a heat dissipation structure 10b. In the heat dissipation structure 10b, a width W6 of each first port 222b connected to a second wider channel 212b is greater than a width W5 of each first port 221b connected to a first wider channel 211b, and a width W8 of each second port 242b connected to a second narrower channel 232b is greater than a width W7 of each second port 241b connected to a first narrower channel 231b. That is, each first port 222b is wider than each first port 221b, and each second port 242b is wider than each second port 241b.

Figure 3:
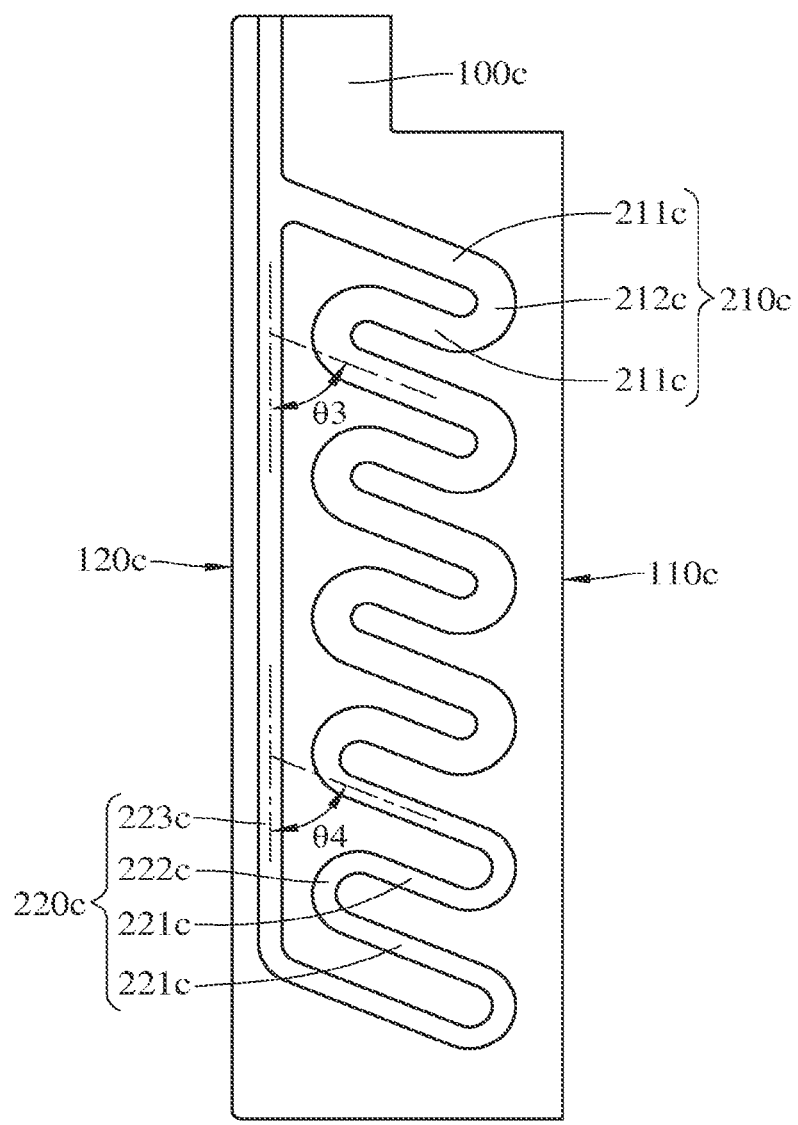
FIG. 3 is a front view of a heat dissipation structure according to a third embodiment of the disclosure.

In the previous embodiments, the wider channels 211a-213a, the narrower channels 231a-233a, and connecting channels 220a and 240a of the channel arrangement 200a are all in straight, but the present disclosure is not limited thereto. Please refer to FIG. 3. FIG. 3 is a front view of a heat dissipation structure according to a third embodiment of the disclosure.

This embodiment provides a heat dissipation structure 10c, the heat dissipation structure 10c has a wider channel portion 210c including a plurality of first inclined channels 211c and a plurality of first curved channels 212c. Two opposite ends of each first curved channel 212c are respectively connected to two of the first inclined channels 211c. The first curved channels 212c and the first inclined channels 211c are arranged along a heat absorbing edge 110c, wherein the first inclined channels 211c are arranged spaced apart from each other and crosswise from the heat absorbing edge 110c to a condensing edge 120c. In addition, the heat dissipation structure 10c further has a narrower channel portion 220c including a plurality of second inclined channels 221c, a plurality of second curved channels 222c and a returning channel 223c. Two opposite ends of each second curved channel 222c are respectively connected to two of the second inclined channels 221c. The second curved channels 222c and the second inclined channels 221c are arranged along the heat absorbing edge 110c, wherein the second inclined channels 221c are arranged spaced apart from each other and crosswise from the heat absorbing edge 110c to the condensing edge 120c. The returning channel 223c is closer to the condensing edge 120c than the first inclined channels 211c and the second inclined channels 221c, and two opposite ends of the returning channel 223c are respectively connected to one of the first inclined channels 211c and one of the second inclined channels 221c that are respectively located at two opposite sides of a heat conductive plate 100c. An angle θ4 between each second inclined channel 221c and the returning channel 223c is equal to an angle θ3 between each first inclined channel 211c and the returning channel 223c. That is, the second inclined channels 221c and the first inclined channels 211c have the same inclination, but the present closure is not limited thereto.

Figure 4:
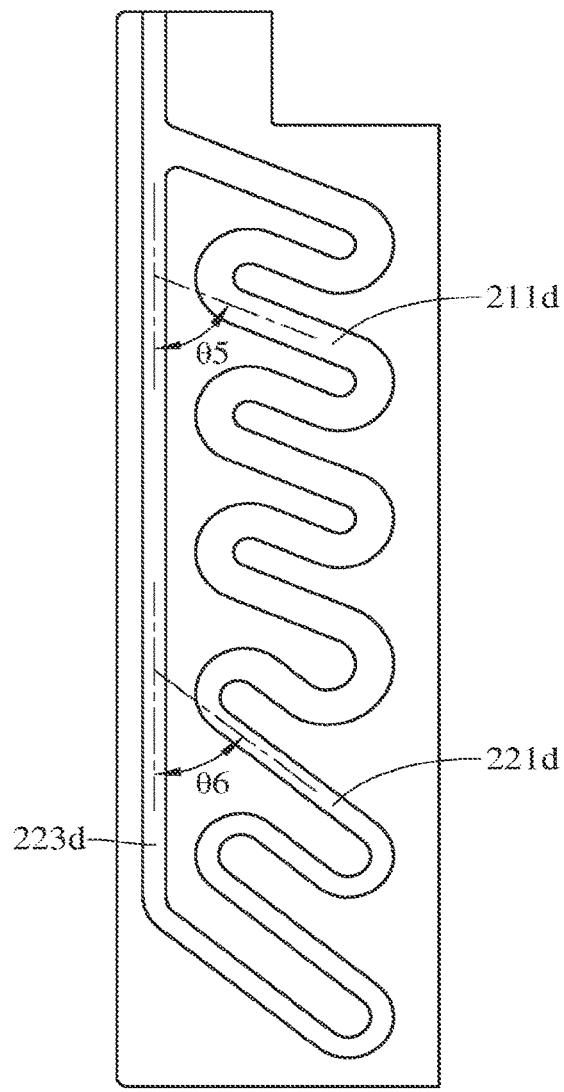
FIG. 4 is a front view of a heat dissipation structure according to a fourth embodiment of the disclosure.

Please refer to FIG. 4. FIG. 4 is a front view of a heat dissipation structure according to a fourth embodiment of the disclosure. This embodiment provides a heat dissipation structure 10d. In the heat dissipation structure 10d, an angle θ6 between each second inclined channels 221d and a returning channel 223d is smaller than an angle θ5 between each first inclined channel 211d and the returning channel 223d. That is, the second inclined channels 221d are more inclined than the first inclined channels 211d.

Figure 5:
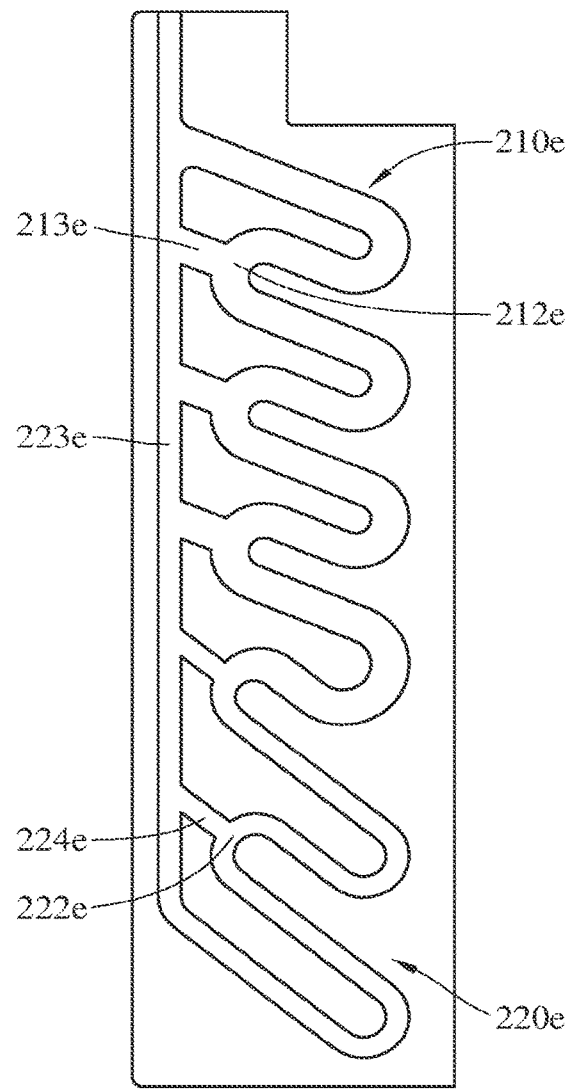
FIG. 5 is a front view of a heat dissipation structure according to a fifth embodiment of the disclosure.

In the embodiment in FIG. 3, the first curved channels 212c and the second curved channels 222c are connected to the returning channel 223c through inclined channels 211c and 221c, but the present disclosure is not limited thereto. Please refer to FIG. 5. FIG. 5 is a front view of a heat dissipation structure according to a fifth embodiment of the disclosure.

This embodiment provides a heat dissipation structure 10e. The heat dissipation structure 10e has a wider channel portion 210e including a plurality of first connecting channels 213e, and two opposite ends of each first connecting channel 213e are respectively connected to a returning channel 223e and one of first curved channels 212e near the returning channel 223e. In addition, a narrower channel portion 220e further includes a plurality of second connecting channels 224e, and two opposite ends of each second connecting channel 224e are respectively connected to the returning channel 223e and one of second curved channels 222e near the returning channel 223e.

In this embodiment, a part of the first curved channels 212e and a part of the second curved channels 222e are respectively connected to the returning channel 223e through the first connecting channels 213e and the second connecting channels 224e, but the present disclosure is not limited thereto. In some other embodiment, a part of the first curved channels near the returning channel and a part of the second curved channels near the returning channel may be directly connected to the returning channel.

Figure 6:
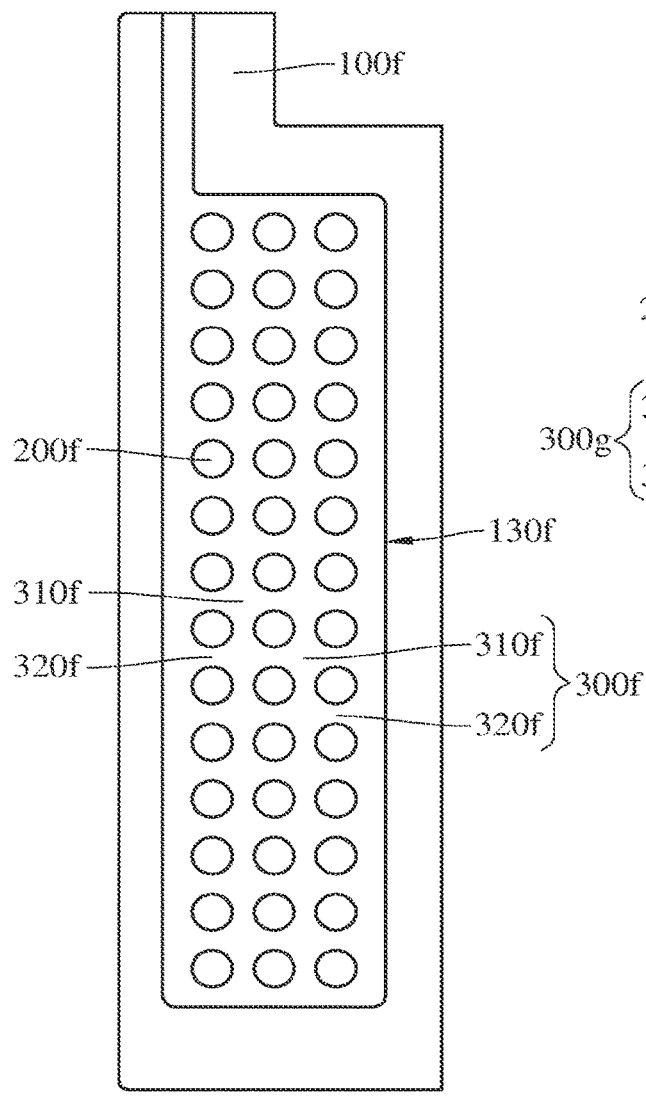
FIG. 6 is a front view of a heat dissipation structure according to a sixth embodiment of the disclosure.

Then, please refer to FIG. 6. FIG. 6 is a front view of a heat dissipation structure according to a sixth embodiment of the disclosure.

This embodiment provides a heat dissipation structure 10f including a heat conductive plate 100f and a plurality of split structures 200f. The heat conductive plate 100f has a fluid storage chamber 130f. The split structures 200f are arranged in an array, and are dent on the heat conductive plate 100f so as to divide the fluid storage chamber 130f into a plurality of wider channels 310f and a plurality of narrower channels 320f that are connected to one another so as to form a channel arrangement 300f. In other word, the split structures 200f are dent on the heat conductive plate 100f, such that the channel arrangement 300f having the wider channels 310f and the narrower channels 320f is formed from the fluid storage chamber 130f. Furthermore, in this embodiment, each split structure 200f is in circular shape, but the present disclosure is not limited thereto.

Figure 7:
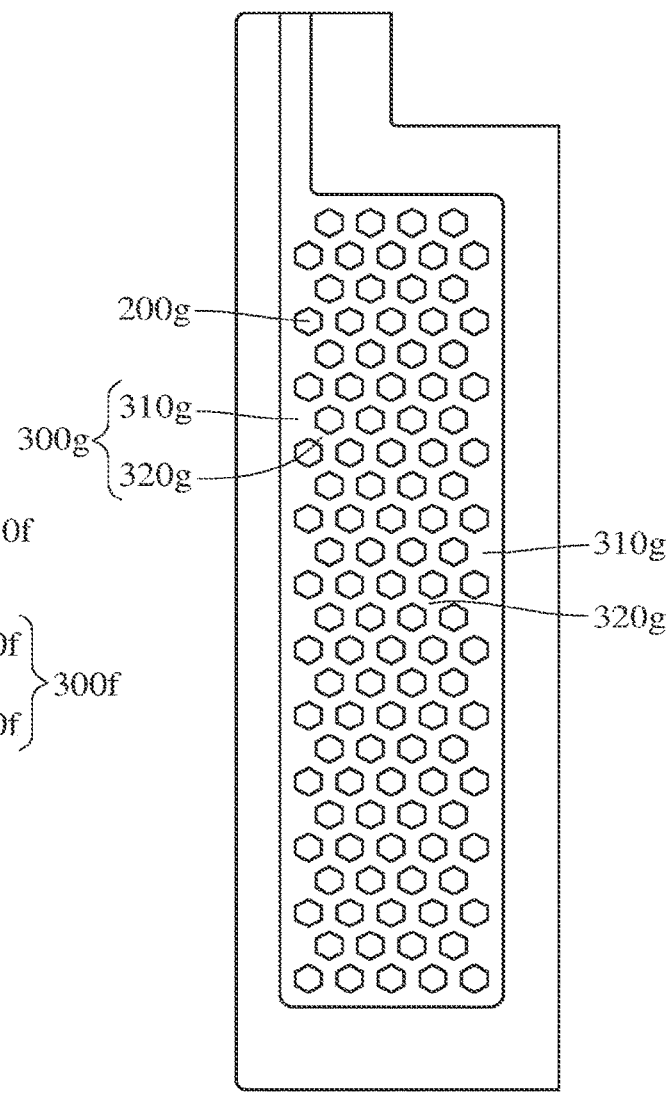
FIG. 7 is a front view of a heat dissipation structure according to a seventh embodiment of the disclosure.

Please refer to FIG. 7. FIG. 7 is a front view of a heat dissipation structure according to a seventh embodiment of the disclosure. This embodiment provides a heat dissipation structure 10g. The heat dissipation structure 10g includes a plurality of split structures 200g which are arranged in a staggered arrangement, and each split structure 200g is in hexagonal shape. In more detail, a plurality of wider channels 310g and a plurality of narrower channels 320g are formed between the split structures 200g, and the wider channels 310g and the narrower channels 320g together form a channel arrangement 300g.

Figure 8:
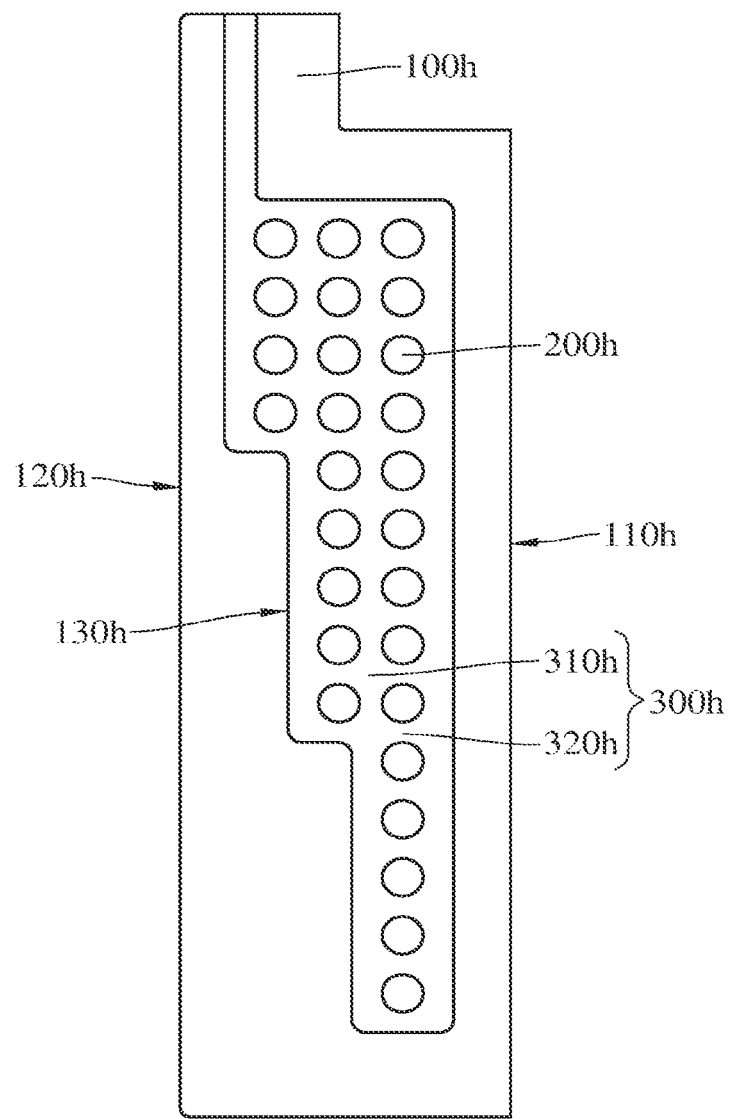
FIG. 8 is a front view of a heat dissipation structure according to an eighth embodiment of the disclosure.

In the split structures in FIG. 6 and FIG. 7, the quantity of the split structures near the heat absorbing edge is equal to the quantity of the split structures near the condensing edge, but the present disclosure is not limited thereto. Please refer to FIG. 8. FIG. 8 is a front view of a heat dissipation structure according to an eighth embodiment of the disclosure. In a heat dissipation structure 10h of this embodiment, the quantity of the split structures 200h near the heat absorbing edge 110h is greater than the quantity of the split structures 200h near the condensing edge 120h. In other words, a part of the split structures 200h near the heat absorbing edge 110h is more than another part of the split structures 200h near the condensing edge 120h; that is, there are more split structures 200h near the heat absorbing edge 110h than the condensing edge 120h. The split structures 200h are dent on a heat conductive plate 100h so as to divide a fluid storage chamber 130h into a plurality of wider channels 310h and a plurality of narrower channels 320h that are connected to one another so as to form a channel arrangement 300h.

Figure 9:
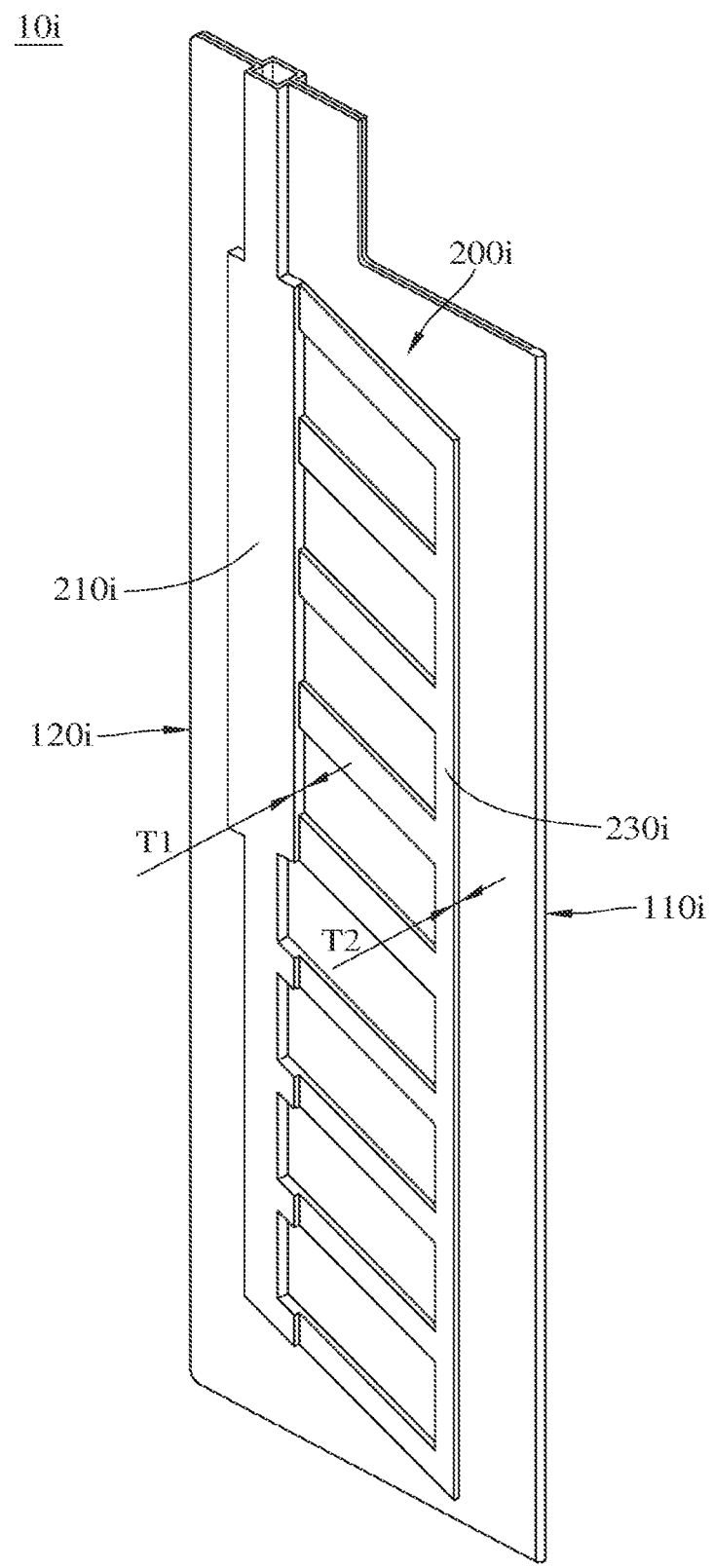
FIG. 9 is a front view of a heat dissipation structure according to a ninth embodiment of the disclosure.

In the previous embodiments, the thickness of each channel arrangement is fixed, but the present disclosure is not limited thereto. Please refer to FIG. 9. FIG. 9 is a front view of a heat dissipation structure according to a ninth embodiment of the disclosure.

This embodiment provides a heat dissipation structure 10i. The heat dissipation structure 10i includes a channel arrangement 200i including a wider channel portion 210i and a narrower channel portion 230i. The wider channel portion 210i and the narrower channel portion 230i are connected to each other to form a loop for the gaseous fluid to be circulated in the channel arrangement 200i. In addition, in this embodiment, a thickness T1 of a side of the channel arrangement 200i near a condensing edge 120i is greater than a thickness T2 of a side of the channel arrangement 200i near a heat absorbing edge 110; that is, the side of the channel arrangement 200i near the condensing edge 120i is thicker than the side of the channel arrangement 200i near the heat absorbing edge 110.

Figure 10:
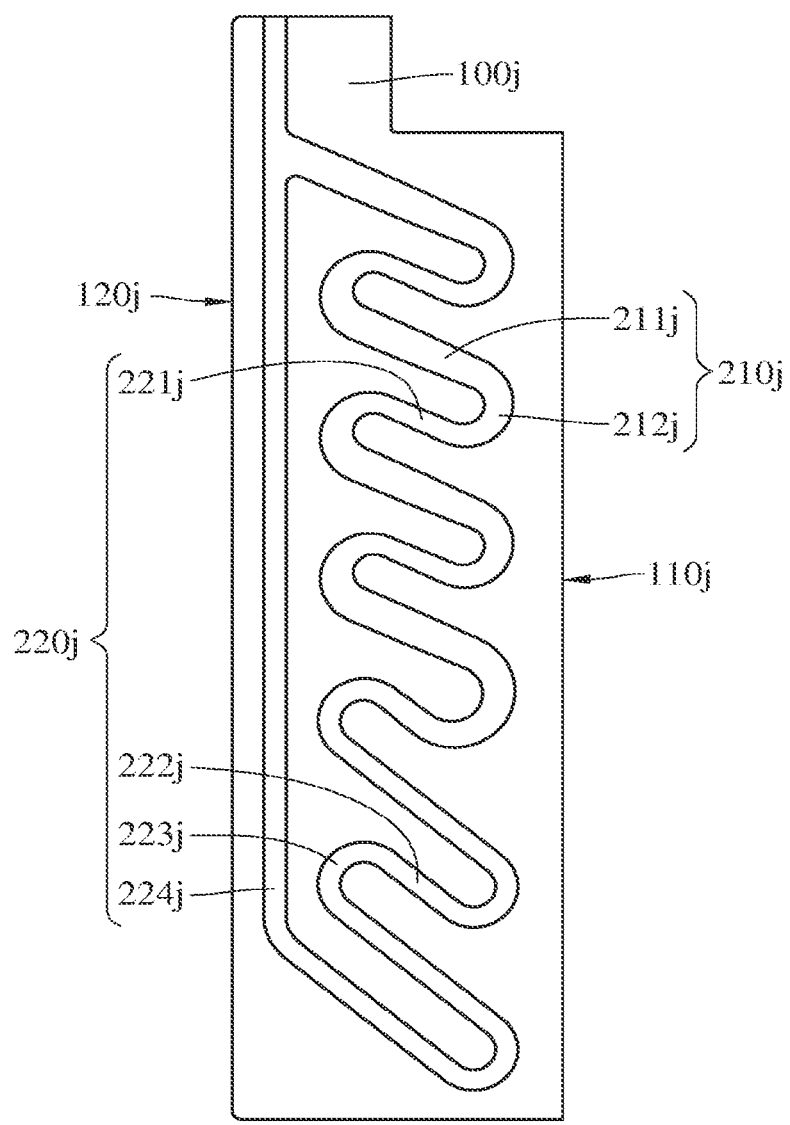
FIG. 10 is a front view of a heat dissipation structure according to a tenth embodiment of the disclosure.

Furthermore, please refer to FIG. 10. FIG. 10 is a front view of a heat dissipation structure according to a tenth embodiment of the disclosure.

This embodiment provides a heat dissipation structure 10j. The heat dissipation structure 10j includes a wider channel portion 210j, which includes a plurality of first inclined channels 211j and a plurality of first curved channels 212j, and a narrower channel portion 220j, which includes a plurality of second inclined channels 221j, a plurality of third inclined channels 222j, a plurality of second curved channels 223j and a returning channel 224j. The first inclined channels 211j, the second inclined channels 221j and the third inclined channels 222j are arranged along a heat absorbing edge 110j; in more detail, the first inclined channels 211j, the second inclined channels 221j and the third inclined channels 222j are arranged spaced apart from each other and crosswise from the heat absorbing edge 110j and a condensing edge 120j. The first inclined channels 211j and the second inclined channels 221j are arranged in a staggered arrangement; that is, one of the first inclined channels 211j is located between two of the second inclined channels 221j. The third inclined channels 222j are located on the same side of the first inclined channels 211j and the second inclined channels 221j. Each of the first curved channels 212j is connected to one of the first inclined channels 211j and one of the second inclined channels 221j that are adjacent to each other, and each of the second curved channels 223j is connected to two of the third inclined channels 222j that are adjacent to each other. The returning channel 224j is closer to the condensing edge 120j than the first inclined channels 211j, the second inclined channel 22j and the third inclined channels 222j, and two opposite ends of the returning channel 224j are respectively connected to one of the first inclined channels 211j and one of the third inclined channels 222j that are respectively located at two opposite sides of the heat conductive plate 100j.

According to the heat dissipation structure as discussed above, the resistance to the gaseous fluid flowing in the wider channel portion is relatively small because the wider channels are wider, such that the flowing velocity of the gaseous fluids is increased, thereby accelerating the circulation of the fluid and improving the heat dissipation capability of the heat dissipation structure.

In addition, the narrower channel portion having relative smaller width is beneficial to create a capillary action when the fluid is flowing therethrough, which helps the fluid to flow more smoothly and fast in the narrower channel portion, thereby improving the heat dissipation capability of the heat dissipation structure.

Moreover, the acute angles between the first connecting channels and the first wider channel and the acute angles between the second connecting channels and the first narrower channel help that the gaseous fluid to move toward the condensing edge through the first connecting channel, and the condensed fluid to return to the heat absorbing edge through the second connecting channel. Therefore, it helps to improve the circulation of the fluid in the channel arrangement so as to improve the heat dissipation capability of the heat dissipation structure.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A heat dissipation structure, adapted to accommodate a fluid and thermally contact at least one heat source, comprising:

a heat conductive plate for thermally contacting the at least one heat source; and a sealed channel arrangement located on the heat conductive plate, the channel arrangement comprising a wider channel portion and a narrower channel portion, the wider channel portion wider than the narrower channel portion, the wider channel portion connected to the narrower channel portion so that the channel arrangement forms a closed loop, and the channel arrangement adapted to accommodate the fluid, such that the fluid absorbs heat generated by the at least one heat source through the heat conductive plate so as to at least partially change phase of the fluid;

wherein the heat conductive plate has a heat absorbing edge and a condensing edge opposite to each other, the wider channel portion comprises a plurality of first inclined channels and a plurality of first curved channels, two opposite ends of each of the plurality of first curved channels are respectively connected to two of the plurality of first inclined channels, the plurality of first curved channels and the plurality of first inclined channels are arranged along the heat absorbing edge, the narrower channel portion comprises a plurality of second inclined channels, a plurality of second curved channels and a returning channel, two opposite ends of each of the plurality of second curved channels are respectively connected to two of the plurality of second inclined channels, the second curved channels and the second inclined channels are arranged along the heat absorbing edge, the returning channel is closer to the condensing edge than the plurality of first inclined channels and the plurality of second inclined channels, and two opposite ends of the returning channel are respectively connected to one of the plurality of first inclined channels and one of the plurality of second inclined channels that are respectively located at two opposite sides of the heat conductive plate;

wherein the plurality of first inclined channels and the plurality of second inclined channels are inclined at an acute angle relative to the returning channel; and wherein an angle between each of the plurality of second inclined channels and the returning channel is smaller than an angle between each of the plurality of first inclined channels and the returning channel.

2. The heat dissipation structure according to the claim 1, wherein a part of the plurality of first curved channels near the returning channel and a part of the plurality of second curved channels near the returning channel are connected to the returning channel.

3. The heat dissipation structure according to the claim 2, wherein the wider channel portion further comprises a plurality of first connecting channels, two opposite ends of each of the plurality of first connecting channels are respectively connected to one of the plurality of first curved channels near the returning channel and the returning channel, the narrower channel portion further comprises a plurality of second connecting channels, and two opposite ends of each of the plurality of second connecting channels are respectively connected to one of the plurality of second curved channels near the returning channel and the returning channel.

* * * * *